US007023099B2

(12) United States Patent
Andreas et al.

(10) Patent No.: US 7,023,099 B2
(45) Date of Patent: Apr. 4, 2006

(54) WAFER CLEANING METHOD AND RESULTING WAFER

(75) Inventors: Michael T. Andreas, Boise, ID (US); Paul A. Morgan, Kuna, ID (US)

(73) Assignee: Micron Technology, INC, Boise, ID (US)

( * ) Notice: Subject to any disclaimer, the term of this patent is extended or adjusted under 35 U.S.C. 154(b) by 0 days.

(21) Appl. No.: 10/927,612

(22) Filed: Aug. 25, 2004

(65) Prior Publication Data

US 2005/0040443 A1 Feb. 24, 2005

Related U.S. Application Data

(62) Division of application No. 10/645,710, filed on Aug. 21, 2003.

(51) Int. Cl.
*H01L 23/544* (2006.01)

(52) U.S. Cl. ...................................... 257/797; 257/283

(58) Field of Classification Search ................ 257/797; 438/401, 975
See application file for complete search history.

(56) References Cited

U.S. PATENT DOCUMENTS

| | | | | |
|---|---|---|---|---|
| 4,862,008 | A * | 8/1989 | Oshida et al. | 250/548 |
| 5,271,798 | A | 12/1993 | Sandhu et al. | |
| 5,477,309 | A * | 12/1995 | Ota et al. | 355/67 |
| 5,711,818 | A | 1/1998 | Jain | |
| 5,747,382 | A * | 5/1998 | Huang et al. | 438/624 |
| 5,789,505 | A | 8/1998 | Wilkinson et al. | |
| 5,978,071 | A * | 11/1999 | Miyajima et al. | 355/53 |
| 6,024,106 | A | 2/2000 | Yang et al. | |
| 6,057,248 | A | 5/2000 | Wu et al. | |
| 6,099,662 | A | 8/2000 | Wang et al. | |
| 6,152,148 | A | 11/2000 | George et al. | |
| 6,157,087 | A * | 12/2000 | Zhao et al. | 257/797 |
| 6,194,366 | B1 | 2/2001 | Naghshineh et al. | |
| 6,265,781 | B1 | 7/2001 | Andreas | |
| 6,387,812 | B1 | 5/2002 | Andreas | |
| 6,431,185 | B1 | 8/2002 | Tomita et al. | |
| 6,447,634 | B1 | 9/2002 | Zahorik et al. | |
| 6,465,403 | B1 | 10/2002 | Skee | |
| 6,468,136 | B1 * | 10/2002 | Lum et al. | 451/41 |
| 6,468,951 | B1 | 10/2002 | Grieger et al. | |
| 6,498,131 | B1 | 12/2002 | Small et al. | |

(Continued)

FOREIGN PATENT DOCUMENTS

EP 1 065 708 A2 1/2001

(Continued)

OTHER PUBLICATIONS

Statement of Material Information , 1 page.

*Primary Examiner*—Tu-Tu Ho
(74) *Attorney, Agent, or Firm*—TraskBritt, PC

(57) ABSTRACT

A method of removing organic particles from a registration mark on a semiconductor wafer. The method comprises providing a semiconductor wafer comprising at least one registration mark at least partially filled with organic particles. The at least one registration mark has a trench width from approximately 1.0 μm to approximately 3.0 μm. The semiconductor wafer is exposed to a cleaning solution comprising tetramethylammonium hydroxide and at least one surfactant, such as an acetylenic diol surfactant. The semiconductor wafer is exposed to an ultrasonic or megasonic vibrational energy. A semiconductor wafer previously subjected to a chemical mechanical planarization treatment and having a reduced amount of organic particles in a registration mark is also disclosed.

4 Claims, 2 Drawing Sheets

U.S. PATENT DOCUMENTS

| | | | | |
|---|---|---|---|---|
| 6,661,105 | B1 | 12/2003 | Yamamoto et al. | |
| 2001/0023127 | A1 | 9/2001 | Andreas | |
| 2003/0198450 | A1* | 10/2003 | Pafchek et al. | 385/129 |
| 2004/0102014 | A1* | 5/2004 | Ning et al. | 438/393 |
| 2004/0132384 | A1 | 7/2004 | Chen | |

FOREIGN PATENT DOCUMENTS

| | | | |
|---|---|---|---|
| WO | WO 02/13242 | A2 | 2/2002 |
| WO | WO 02/086959 | A2 | 10/2002 |
| WO | WO 03/006598 | A1 | 1/2003 |

* cited by examiner

WAFER CLEANING METHOD AND RESULTING WAFER

CROSS-REFERENCE TO RELATED APPLICATION

This application is a divisional of application Ser. No. 10/645,710, filed Aug. 21, 2003, pending.

BACKGROUND OF THE INVENTION

1. Field of the Invention

The present invention relates to a method of cleaning a semiconductor wafer and, more particularly, to a method of cleaning registration marks on the semiconductor wafer, as well as to a wafer subsequent to such cleaning.

2. State of the Art

To fabricate an integrated circuit on a semiconductor substrate such as a semiconductor wafer, multiple layers of conductive or insulative materials are patterned and formed upon one another. In order to preserve circuit continuity, it is critical that each layer is aligned to the previous layer with great precision and accuracy. The alignment of the layers is accomplished using a wafer stepper, which transfers a desired pattern from a reticle or mask onto a layer formed on the semiconductor wafer. In a typical alignment operation, the semiconductor wafer is coated with a transparent photosensitive material, such as a photoresist, and loaded into the wafer stepper. The wafer stepper uses registration or alignment marks on the semiconductor wafer as a reference point to precisely align the mask to the previous layer on the semiconductor wafer. The registration marks are typically formed on unused portions of the semiconductor wafer, such as along a peripheral edge of the semiconductor wafer or near scribe lines that separate locations of semiconductor dice, by etching small, narrow trenches on the semiconductor wafer. Currently, the trenches are approximately 3 μm wide. However, with the current trend towards smaller semiconductor chips in the semiconductor industry, the width of the trenches is also decreasing. The trenches are formed in a known pattern, orientation, and spatial relationship. Depending on the pattern formed by the trenches, these structures are known as registration boxes or scribe line marks ("SLM"). For convenience, the term "registration mark" is used herein to refer to both registration boxes and SLMs.

The wafer stepper uses a laser beam with a fixed wavelength to sense the position of the registration mark on the semiconductor wafer. Light from the laser beam is reflected off the registration mark to create a diffraction pattern, which is reflected to sensing devices and used to indicate the exact position of the registration mark. The registration mark is aligned with corresponding marks on other layers to ensure that the layers are properly aligned.

During processing of the semiconductor wafer, the registration marks oftentimes become filled with debris. The debris is produced by various processes, such as by abrasive processes, including chemical mechanical planarization ("CMP"). CMP processes are typically used to planarize a surface layer of the semiconductor wafer upon which conductive features, such as interlayer connectors and conducting lines, are to be formed. The surface layer may be any exposed surface layer, such as a metallic layer or a dielectric layer. CMP is commonly used to planarize tungsten ("W") layers used in integrated circuits; this process is referred to as WCMP.

Interlayer connectors may be fabricated by forming holes through a dielectric layer, depositing a metal liner over the dielectric layer and into the holes, depositing a metallic layer over the metal liner to fill the holes, and then planarizing the metallic surface layer to an endpoint near the upper surface of the dielectric layer. The conducting lines may be created by forming trenches in the semiconductor substrate, depositing a metal liner over the semiconductor substrate and into the trenches, depositing a metallic layer over the metal liner and in the trenches to fill the trenches, and then planarizing the metal layer to an endpoint near the upper surface of the semiconductor substrate.

During CMP, a polishing pad is pressed against the semiconductor wafer in the presence of a slurry solution under controlled chemical, pressure, velocity, and temperature conditions. The surface layer is planarized using a slurry solution that includes abrasive particles such as aluminum oxide ("$Al_2O_3$") particles, which mechanically remove a portion of the surface layer. The slurry solution also typically contains chemical agents that attack the surface layer. After being planarized, the surface layer is cleaned to remove residual materials produced by the CMP process. The materials may include, for example, particles from the slurry solution, the polishing pad, or the surface layer of the semiconductor wafer. Without cleaning, these particles remain on the semiconductor wafer and contaminate the planarized surface or the registration marks.

The narrow width of these trenches results in particles becoming trapped in the trenches. The particles are present below the polished surface of the semiconductor wafer and, as such, are hard to remove. Moreover, due to the trenches' narrow dimensions, the debris is not easily removed by conventional cleaning techniques, such as by conventional post-CMP cleans. While conventional post-CMP cleans effectively remove the particles on the planarized surface, these cleans do not effectively remove the particles from the registration marks. If the particulate debris remains in the registration marks, registration errors occur because the registration marks cannot be located and used by the wafer stepper. In addition, in subsequent processing, the debris can scatter from the registration marks and cause defect patterns on the active portions of the semiconductor wafer. For instance, if the semiconductor wafer is spun dry after a post-CMP scrubbing, the debris can scatter from the registration marks and become deposited on the active portions of the semiconductor wafer.

To prevent debris from accumulating in the registration marks during, for example, interconnect or trench formation, a coating of photoresist has been applied to the registration mark before the metallic surface layer is planarized. However, this solution is not optimal because it increases the time as well as the number of steps required to fabricate semiconductor dice, which increase the overall cost of the semiconductor dice.

U.S. Pat. No. 6,057,248 to Wu et al. discloses removing residual contaminants from an alignment mark on a semiconductor wafer after CMP. The semiconductor wafer is scrubbed and dipped in a hydrogen fluoride solution to remove a layer damaged by the CMP. The semiconductor wafer is then cleaned using a solution of ammonium hydroxide, hydrogen peroxide, and deionized water that is agitated by ultrasonic or megasonic energy.

In U.S. Pat. No. 5,271,798 to Sandhu et al., a method of selectively etching material from the alignment marks is disclosed. An etchant agent is dispensed through an etchant dispensing apparatus onto the alignment marks. The etchant dispensing apparatus forms a leakproof seal with a surface of the semiconductor wafer to prevent the etchant agent from contacting other portions of the semiconductor wafer. Etching byproducts are removed from the semiconductor wafer by suction. Similarly, in U.S. Pat. No. 6,447,634 to Zahorik et al., an etchant-dispensing apparatus is used to dispense an etchant agent onto one of the registration marks. The dispensed etchant agent is localized around the registration mark and etches the material from the registration mark without damaging other portions of the semiconductor wafer. The etchant agent is subsequently removed from the surface of the semiconductor wafer. One disadvantage of using these apparatuses is that since they must be placed over the alignment marks, throughput of this cleaning method is limited because the semiconductor wafers must be cleaned one at a time.

It would be desirable to be able to remove debris from contaminated registration marks without additional, costly manufacturing steps. It would also be desirable to selectively remove the debris from the contaminated registration marks without the risk of etching other layers of the semiconductor wafer.

BRIEF SUMMARY OF THE INVENTION

The present invention, in one embodiment, relates to a method of removing particulate debris and, more specifically, organic particulate debris from a registration mark on a semiconductor wafer. As used herein, the term "semiconductor wafer" refers to a conventional semiconductor wafer or other bulk substrate comprising a layer of semiconductor material. The term "bulk substrate" as used herein includes not only silicon wafers, but silicon on insulator (SOI) substrates, silicon on sapphire (SOS) substrates, epitaxial layers of silicon on a base semiconductor foundation and other semiconductor materials, such as silicon-germanium, germanium, gallium arsenide and indium phosphide. The method comprises providing a semiconductor wafer comprising at least one registration mark contaminated with undesired particles. The at least one registration mark may have a trench width from approximately 1.0 μm to approximately 3.0 μm. The semiconductor wafer is exposed to a cleaning solution comprising tetramethylammonium hydroxide and at least one surfactant that is an acetylenic diol surfactant, such as Surfynol® CT-131. The semiconductor wafer may be exposed to the cleaning solution by immersing the semiconductor wafer in the cleaning solution or by spraying the semiconductor wafer with the cleaning solution. The at least one surfactant may have a pH greater than approximately 7.5, such as a pH greater than approximately 9 or greater than approximately 10. The at least one surfactant may comprise from approximately 20% to approximately 50% α-(nonylphenyl)-omega-hydroxy-branched poly (oxy-1,2-ethanediyl) and from approximately 2% to approximately 10% 2,4,7,9-tetramethyl-5-decyne-4,7-diol-ethoxylate. The semiconductor wafer is also exposed to an ultrasonic or megasonic vibrational energy in the presence of the cleaning solution.

The present invention, in another embodiment, also relates to a semiconductor wafer exhibiting a reduced amount of particulate debris present in a registration mark. The semiconductor wafer may have been previously subjected to a chemical mechanical planarization treatment. The semiconductor wafer comprises at least one registration mark having at least one trench that has less than approximately 13% of its surface area contaminated with organic particles.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
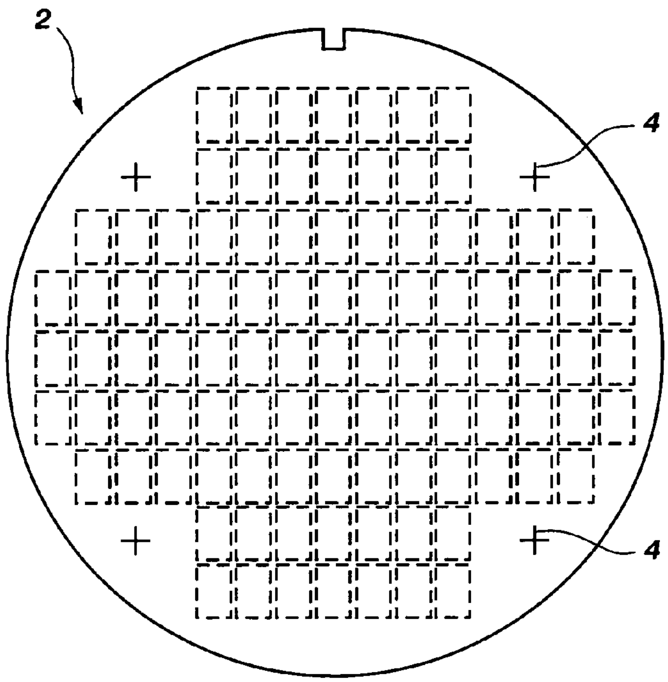
FIG. 1 is a schematic illustration of a semiconductor wafer having registration marks.
Figure 2A:
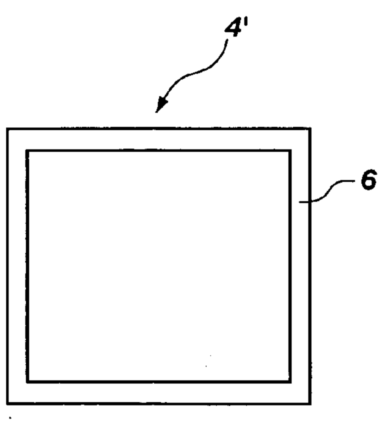
FIG. 2A schematically illustrates a registration box and FIG. 2B schematically illustrates a scribe line mark.
Figure 2B:
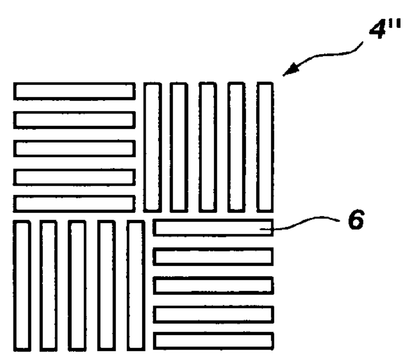

The present invention relates to a method of cleaning registration marks on a semiconductor wafer. Particulate debris in the registration marks may be removed by exposing the semiconductor wafer to a cleaning solution in the presence of a vibrational energy. While the debris is removed, the cleaning solution and the vibrational energy may have a minimal effect on other structures on the semiconductor wafer, such as integrated circuits or exposed surface layers. As shown in FIG. 1, the semiconductor wafer 2 may include at least one registration mark 4 on its surface. The registration mark 4 may be a registration box 4' or an SLM 4" that includes trenches 6 having a width of up to approximately 3 μm, as shown in FIGS. 2A and 2B, respectively. The trenches 6 may have a width from approximately 0.5 μm to approximately 2.8 μm. Trenches 6 of 2.8 μm and 1.2 μm are currently used in photoalignment processes and the use of narrower trench widths is being investigated. While FIGS. 2A and 2B show a registration box 4' and an SLM 4" having a specific, exemplary pattern, it is understood that the registration marks 4 may include other patterns. The registration mark 4 may be formed by conventional techniques, such as by etching the trenches 6 into the surface of a semiconductor wafer 2. The semiconductor wafer 2 may be subjected to CMP to remove an exposed surface layer. As used herein, the term "CMP" is not limited to chemical and/or mechanical planarization processes but also encompasses abrasive planarization processes. For the sake of example only, the surface layer may be a tungsten layer. However, it is understood that the surface layer may formed from additional materials, such as dielectric or insulative materials.

Figure 3A:
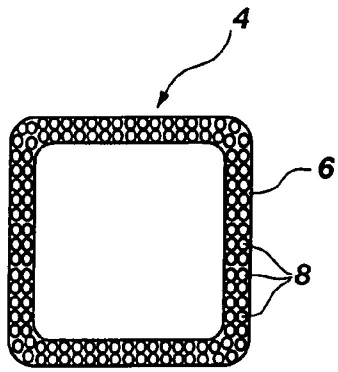
FIGS. 3A and 3B schematically illustrate organic particles present in the registration mark before and after cleaning.

After CMP, the trenches 6 of the registration marks 4 may be partially or completely filled with particles. These particles may include organic particles, particles from the slurry solution, or particles of the surface layer removed by the CMP. In one embodiment, the particles are organic particles 8, as shown in FIG. 3A. The organic particles 8 are believed to result from a polishing pad used in the CMP. Polishing pads are known in the art and may be formed from a soft, porous material, such as an organic polymer. For instance, the polishing pad may be formed from polyurethanes, polyesters, or other organic polymers. However, the organic particles 8 may also originate from other sources that include carbon. The amount of organic particles 8 present in the trenches 6 may vary, depending on the CMP process that is used. For instance, one type of CMP process may result in greater than approximately 65% of the surface area of the registration marks becoming contaminated with organic particles 8 while a different type of CMP process may result in less than 30% of the surface area of the registration marks becoming contaminated. In other words, approximately 65% of the surface area of the trenches 6 in the registration mark 4 may be filled with the organic particles 8. Regardless of the type of CMP process used, the cleaning method of the present invention may drastically reduce the amount of organic particles 8 present in the registration marks 4.

The semiconductor wafer 2 contaminated with organic particles 8 is exposed to the cleaning solution, which may be an aqueous solution including tetramethylammonium hydroxide ("TMAH") and at least one surfactant. The organic particles 8 may be removed from the semiconductor wafer 2 by immersion cleaning or by spray-cleaning, as described in detail below. The TMAH may be present in the cleaning solution from approximately 0.01 percent by weight ("wt %") to approximately 25 wt %. If immersion cleaning is used to remove the organic particles 8, the TMAH may be present in the cleaning solution from approximately 0.1 wt % to approximately 25 wt %. In one embodiment, the TMAH is present from approximately 0.2 wt % to approximately 3 wt %. If spray-cleaning is used, the TMAH may be present in the cleaning solution from approximately 0.01 wt % to approximately 1.0 wt %. In one embodiment, the TMAH is present from approximately 0.05 wt % to approximately 0.2 wt %.

The surfactant may be an anionic, nonionic, or cationic surfactant or a combination of anionic, nonionic, and/or cationic surfactants. The surfactant may be a surfactant based on acetylenic diol chemistry, such as the Surfynol® series of surfactants, which are available from Air Products and Chemicals, Inc. (Allentown, Pa.). In one embodiment, the surfactant is Surfynol® CT-131. Surfynol® CT-131 is a solvent-free, nonionic/anionic grind aid and includes 52% active liquid. Surfynol® CT-131 is a proprietary surfactant blend that includes 20–50% α-(nonylphenyl)-omega-hydroxy-branched poly (oxy-1,2-ethanediyl) (CAS No. 68412-54-4) and 2–10% 2,4,7,9-tetramethyl-5-decyne-4,7-diol-ethoxylate (CAS No. 126-86-3). The surfactant may be present in the cleaning solution from approximately 10 parts per million ("ppm") by weight to approximately 1000 ppm. If immersion cleaning is used to remove the organic particles 8, the surfactant may be present in the cleaning solution from approximately 100 ppm to approximately 1000 ppm. Desirably, the surfactant is present at approximately 100 ppm to approximately 300 ppm. If spray-cleaning is used, the surfactant may be present in the cleaning solution from approximately 10 ppm to approximately 100 ppm. The cleaning solution may have a pH of greater than approximately 7.5, such as a pH of greater than approximately 9 or a pH of greater than approximately 10.

The vibrational energy to which the semiconductor wafer 2 is exposed in the presence of the cleaning solution may be an ultrasonic frequency or megasonic frequency vibrational energy. Applied ultrasonic energy may range from a frequency of approximately 40 kHz to approximately 104 kHz. If a megasonic frequency is used, the frequency may range from approximately 850 kHz to approximately 1.5 MHz.

The semiconductor wafer 2 may be exposed to the cleaning solution and the vibrational energy at a sufficient temperature and for a sufficient amount of time to remove the organic particles 8. The cleaning solution may be applied at an ambient temperature of approximately 25° C. or heated to a temperature up to approximately 65° C. For instance, the organic particles 8 may be more efficiently removed at higher temperatures, such as from approximately 55° C. to approximately 65° C., in comparison to the removal observed at ambient temperature. The exposure time may depend on the temperature used and the amount of organic particles 8 in the registration marks 4. The exposure time may range from approximately 2 minutes to approximately 45 minutes. At higher temperatures, a sufficient exposure time may range from approximately 10 minutes to approximately 15 minutes, while at ambient temperature, a longer exposure time may be necessary.

The organic particles 8 may be removed from the registration marks 4 by contacting the semiconductor wafer 2 with the cleaning solution. For instance, the organic particles 8 may be removed by immersion cleaning or by spray-cleaning. In one embodiment, the semiconductor wafer 2 is immersed in the cleaning solution. The semiconductor wafer 2 may be placed in a tank, such as a stainless steel tank, containing a sufficient volume of the cleaning solution to completely immerse the semiconductor wafer 2. For sake of example only, the cleaning solution may circulate from the bottom of the tank and flow over and across the semiconductor wafer or wafers immersed in the tank from the top of the tank. Organic particles 8 removed from the registration marks 4 may be filtered or otherwise removed from the cleaning solution so that the cleaning solution may be reused. The tank may be of a sufficient size to accommodate multiple semiconductor wafers 2. Therefore, more than one semiconductor wafer 2 may be cleaned simultaneously and the method of the present invention provides a suitable, easily implemented approach to rapidly removing the organic particles 8 from the registration marks 4. For instance, a rack that holds multiple semiconductor wafers 2 may be immersed in the tank. The tank structure and configuration is not critical to the operability of the present invention and may be a conventional tank that is capable of providing the necessary vibrational energy and temperature environment. For instance, the tank may include variable temperature settings that allow the temperature of the cleaning solution to be adjusted. The tank may also include a vibrational source configured to provide variable frequency vibrational energy settings to the tank and cleaning solution therein. For sake of example only, the vibrational source associated with the tank may have vibrational energy frequency settings of 40 kHz, 72 kHz, or 104 kHz. Currently, it is believed that a vibrational energy of 40 kHz is efficacious for practicing the present method. One suitable tank for use in practicing the present invention is a 40 kHz, stainless steel, process tank offered by JST Manufacturing, Inc. (Boise, Id.).

In another embodiment, the semiconductor wafer 2 may be sprayed with the cleaning solution to remove the organic particles 8. The semiconductor wafer 2 may be rotated during spraying, such as from approximately five revolutions per minute ("rpm") to approximately 500 rpm. The cleaning solution may contact the semiconductor wafer 2 by directing a spray, such as a high-pressure jet spray or a high-velocity aerosol spray, of the cleaning solution at the semiconductor wafer 2. For sake of example only, the high-pressure jet spray may be generated using a spray nozzle that includes a fine orifice and a pump. These nozzles are known in the art and are not described in detail herein. The high-velocity aerosol spray may be generated using a spray nozzle that includes a concentric or crossflow nebulizer. The high-velocity aerosol spray may include a carrier gas in addition to the cleaning solution. However, it is understood that other techniques of forming the spray may be used, as known in the art. The spray of cleaning solution may be delivered in any configuration, such as a needle spray or a fan spray. A pressure at which the cleaning solution is applied to the semiconductor wafer 2 may be sufficient to remove the organic particles 8. For instance, if a high-pressure jet spray is used, the pressure may range from approximately 50 MPa to approximately 200 MPa. If a high-velocity aerosol spray is used, the pressure may range from approximately 50 m/sec to approximately 200 m/sec. The semiconductor wafer 2 may be exposed to the spray for a sufficient amount of time to remove the organic particles 8. It is understood that registration marks 4 having wider trench widths, such as 2.8 μm, may require shorter exposure times than those having narrow trench widths, such as 1.2 μm. Depending on the type of spray used and the trench width of the registration marks 4, the exposure time may range from approximately 30 seconds to approximately 300 seconds.

It is also contemplated that the semiconductor wafer 2 may be vibrated, such as at an ultrasonic or megasonic frequency, during the spray cleaning. As previously mentioned, the cleaning solution may also be sprayed through an ultrasonic nozzle or a megasonic nozzle. It is also contemplated that the semiconductor wafer 2 may be exposed to an additional cleaning process before, during, or after it has been exposed to the cleaning solution. For instance, the semiconductor wafer 2 may be exposed to the vibrational energy before, during, or after it has been sprayed to assist in dislodging the contaminant particles.

The cleaning solution used to spray-clean the semiconductor wafer 2 may include the aqueous solution of TMAH and at least one surfactant, as previously described. However, the relative amount (weight percent) of TMAH necessary in the spray-cleaning process may be reduced compared to the amount used in the immersion cleaning process. For instance, the TMAH may be present from approximately 0.01 wt % to approximately 1.0 wt %.

Figure 3B:
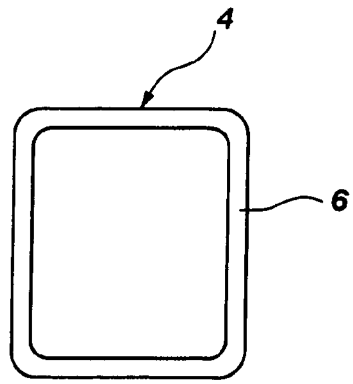

As shown in FIG. 3B, the amount of organic particles 8 remaining in the registration marks 4 after the cleaning may be reduced or eliminated compared to the amount of contamination before the cleaning. For instance, less than approximately 13% of the surface area of the registration mark 4 may be contaminated with the organic particles 8 after the cleaning. More desirably, the registration mark 4 has less than approximately 10% of its surface area contaminated with the organic particles 8. Most desirably, the registration mark is substantially free of organic particles, such as having approximately 0% of the surface area of the registration mark 4 contaminated with the organic particles 8.

In addition to removing the organic particles 8 from the registration marks 4, the cleaning solution and vibrational energy applied in accordance with the present invention may have little or no adverse effect on other structures of the semiconductor wafer 2. In other words, the cleaning solution and vibrational energy do not damage these structures, such as by etching the structures or producing pinholes in the structures. For sake of example only, the cleaning solution and vibrational energy may not etch or produce pinholes in a tungsten layer on the semiconductor wafer 2.

It is also contemplated that the cleaning method of the present invention may be used in conjunction with conventional post-CMP cleans to reduce the contamination in the registration marks. For instance, the cleaning method of the present invention may be used to remove the organic particles 8 from the registration marks 4 while a conventional cleaning method may be used to remove other contaminants, such as particles of the slurry solution or the surface layer.

EXAMPLES

Semiconductor wafers 2 having a surface layer of tungsten were exposed to the cleaning solutions and vibrational energies described below to determine whether these conditions reduced the amount of organic particles 8 in the registration marks 4 without damaging the tungsten layer. The registration marks 4 included trench widths of 2.8 μm. The contamination in the registration marks included mostly carbon, as determined by energy dispersive spectroscopy ("EDS"). The carbon was believed to originate from the polishing pads (such as Politex® pads available from Rodel, Inc. (Phoenix, Ariz.)) used to CMP the tungsten layer.

The registration marks 4 (registration boxes 4' or SLMs 4") were examined by scanning electron microscopy ("SEM") to determine the amount of contamination before the cleaning. SEMS were also taken after the cleaning to determine the amount of contamination remaining in the registration marks. The improvement in contamination was determined by calculating the summed length of the contaminated registration marks divided by the total length of the trenches visible in the SEMs. The percent residue was calculated using the following formula:

$$\%\ \text{Residue}=\Sigma_{residue\ length}/\Sigma_{trench\ length}$$

The removal efficiency was calculated using the following formula:

$$\text{Removal Efficiency}=[[\Sigma_{residue(pre)}-\Sigma_{residue(post)}]/\Sigma_{residue(pre)}]\times 100,$$

where "residue(pre)" refers to the percentage of residue before cleaning and "residue(post)" refers to the percentage of reside after cleaning.

Example 1

Effect of Cleaning Solutions Including 25% TMAH or 25% TMAH and Surfynol® CT131

Semiconductor wafers 2 having registration marks 4 contaminated with organic particles 8 were exposed to a cleaning solution that included either 25% TMAH or 25% TMAH and 300 ppm Surfynol® CT131. The semiconductor wafers 2 were placed in a tank that included each of the cleaning solutions. The semiconductor wafers 2 were exposed to 40 kHz of energy for 15, 30, or 45 minutes.

As shown in Table 1, the semiconductor wafers 2 exposed to the cleaning solution having 25% TMAH and 300 ppm Surfynol® CT-131 had reduced amounts of organic particles 8 compared to both the control semiconductor wafer and the semiconductor wafers 2 exposed to 25% TMAH. While the semiconductor wafers 2 exposed to the 25% TMAH cleaning solution showed less contamination than the control semiconductor wafer, the 25% TMAH cleaning solution undesirably damaged the tungsten layer.

TABLE 1

Contamination Results Using Cleaning Solutions Including 25% TMAH or 25% TMAH with 300 ppm Surfynol ® CT-131.

| Cleaning Solution | Temperature (° C.) | Energy (kHz) | Time (min) | SLM Contamination (%) | Comments |
|---|---|---|---|---|---|
| Control | None | 40 | 0 | 59.9 | Heavily contaminated |
| 25% TMAH | 65 | 40 | 15 | 0 | W pitted |
| 25% TMAH | 65 | 40 | 30 | 0 | W partially gone |
| 25% TMAH | 65 | 40 | 45 | 0 | W gone |
| 25% TMAH, 300 ppm Surfynol ® CT131 | 65 | 40 | 15 | 0 | Clear |
| 25% TMAH, 300 ppm Surfynol ® CT131 | 65 | 40 | 30 | 0 | Clear |
| 25% TMAH, 300 ppm Surfynol ® CT131 | 65 | 40 | 45 | 0 | W partially gone |

Example 2

Effect of a Cleaning Solution Including 2.25% TMAH or 2.25% TMAH and Surfynol® CT131

Semiconductor wafers 2 having registration marks 4 contaminated with organic particles 8 were exposed to a cleaning solution that included either 2.25% TMAH or 2.25% TMAH and 300 ppm Surfynol® CT131. The semiconductor wafers 2 were placed in tanks that included each of the cleaning solutions. The semiconductor wafers 2 were exposed to 850 kHz of energy for 1.7, 2.5, 6.7, 8.3, or 10 minutes.

As shown in Table 2, these conditions were less effective in removing the organic particles 8 than the conditions described in Example 1.

TABLE 2

Contamination Results Using Cleaning Solutions Including 2.25% TMAH or 2.25% TMAH with 300 ppm Surfynol ® CT-131.

| Cleaning Solution | Temperature (° C.) | Energy (kHz) | Time (min) | Box Contamination (%) | SLM Contamination (%) |
|---|---|---|---|---|---|
| 2.25% TMAH | 60 | 850 | 2.5 | 4.7 | 7.1 |
| 2.25% TMAH, 300 ppm Surfynol ® CT-131 | 60 | 850 | 1.7 | 7.3 | 13.2 |
| 2.25% TMAH, 300 ppm Surfynol ® CT-131 | 60 | 850 | 6.7 | 2.5 | 9.6 |
| 2.25% TMAH, 300 ppm Surfynol ® CT-131 | 60 | 850 | 8.3 | 6.0 | 1.3 |
| 2.25% TMAH, 300 ppm Surfynol ® CT-131 | 60 | 850 | 10 | 12.4 | 11.3 |

Example 3

Effect of a Cleaning Solution Including Varying Concentrations of TMAH and Surfynol® CT-131

The effect of varying the TMAH concentration while keeping the concentration of Surfynol® CT-131 constant at 300 ppm was also investigated. As shown in Table 3, TMAH concentrations of 2.8% and 10.3% showed reduced contamination levels compared to a cleaning solution with no TMAH and 300 ppm Surfynol® CT-131.

TABLE 3

Contamination Results Using Cleaning Solutions Having Varying Concentrations of TMAH with 300 ppm Surfynol ® CT-131.

| Cleaning Solution | Temperature (° C.) | Energy (kHz) | Time (min) | Box Contamination (%) | SLM Contamination (%) |
|---|---|---|---|---|---|
| 0% TMAH, 300 ppm Surfynol ® CT-131 | 60 | 40 | 10 | 33.8 | 7.9 |
| 0% TMAH, 300 ppm Surfynol ® CT-131 | 60 | 40 | 20 | 13.1 | 4.7 |
| 2.8% TMAH, 300 ppm Surfynol ® CT-131 | 60 | 40 | 10 | 6.5 | 1.5 |
| 2.8% TMAH, 300 ppm Surfynol ® CT-131 | 60 | 40 | 20 | 0.8 | 0.2 |
| 10.3% TMAH, 300 ppm Surfynol ® CT-131 | 60 | 40 | 10 | 10.0 | 5.6 |
| 10.3% TMAH, 300 ppm Surfynol ® CT-131 | 60 | 40 | 20 | 10.6 | 7.4 |

Example 4

Effects of Varying Vibrational Energies Using a Cleaning Solution Including 2% TMAH with 300 ppm Surfynol® CT131

Figure 4:
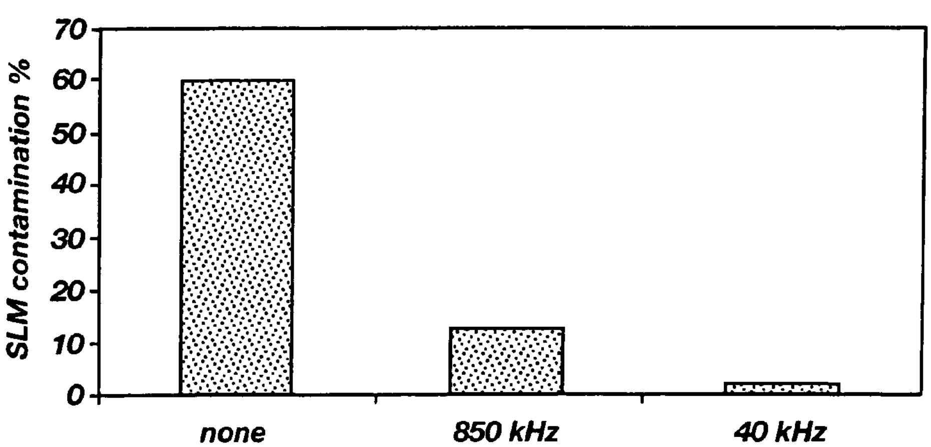
FIG. 4 graphically illustrates the amount of contamination of organic particles at various vibrational energies.

The amount of organic particles 8 in the registration marks 4 was also measured at different vibrational energies while keeping the TMAH and Surfynol® CT-131 concentrations constant at 2% TMAH and 300 ppm Surfynol® CT-131. The semiconductor wafers 2 were exposed to the cleaning solution for 10 minutes while exposed to a selected frequency of vibrational energy. The tested energy levels were 0 kHz (no energy), 850 kHz, and 40 kHz. As shown in FIG. 4, the semiconductor wafer 2 that was not exposed to energy had approximately 60% contamination. The semiconductor wafers exposed to either of the energy levels showed less than approximately 10% contamination, with the semiconductor wafer exposed to 40 kHz exhibiting a significantly lower percentage of contamination than that exposed to 850 kHz.

Example 5

Effect of Trench Width

The cleaning solutions and vibrational energies described in Examples 1–4 are used to reduce or eliminate the amount of organic particles in registration marks 4 having trench widths of 1.0 μm, 1.2 μm, or 1.4 μm.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope thereof as defined by the following appended claims.

What is claimed is:

1. A semiconductor wafer previously subjected to an abrasive planarization treatment and having a reduced amount of organic particles in at least one registration mark thereon, wherein the at least one registration mark comprises at least one trench comprising less than approximately 13% of its surface area filled with the organic particles and wherein the at least one trench has a trench width ranging from approximately 0.5 μm to approximately 3.0 μm.

2. The semiconductor wafer of claim 1, wherein the at least one registration mark comprises at least one trench comprising less than approximately 10% of its surface area filled with the organic particles.

3. The semiconductor wafer of claim 1, wherein the at least one registration mark comprises at least one trench comprising less than approximately 5% of its surface area filled with the organic particles.

4. The semiconductor wafer of claim 1, wherein the at least one trench has a trench width ranging from approximately 0.5 μm to approximately 2.8 μm.

* * * * *